United States Patent

Hepher et al.

[11] 4,041,204
[45] Aug. 9, 1977

[54] DRY TRANSFER SHEETS

[75] Inventors: Martin Hepher, Berkhampstead; John Arthur Sperry, Chalfont St. Peters; Malcolm John Stewart, London, all of England

[73] Assignee: The Autotype Company Limited, London, England

[21] Appl. No.: 434,595

[22] Filed: Jan. 18, 1974

[30] Foreign Application Priority Data

Jan. 18, 1973 United Kingdom ............... 2685/73
Feb. 1, 1973 United Kingdom ............... 5177/73

[51] Int. Cl.² .................... B32B 3/00; B32B 7/06
[52] U.S. Cl. .................... 428/199; 96/28; 156/240; 427/152; 428/195; 428/200; 428/202; 428/914
[58] Field of Search ............ 428/199, 195, 914, 200, 428/202; 427/152; 156/239, 240; 96/28

[56] References Cited

U.S. PATENT DOCUMENTS

| 3,353,955 | 11/1967 | Colgrove ........................... 96/28 |
| 3,660,088 | 5/1972 | Lundsager ........................ 96/28 X |
| 3,736,138 | 5/1973 | Held ................................. 96/28 |
| 3,764,318 | 10/1973 | Laridon ........................... 96/28 X |
| 3,770,438 | 11/1973 | Celeste ............................ 96/28 X |
| 3,775,113 | 11/1973 | Bonham et al. .................. 96/28 |
| 3,928,710 | 12/1975 | Arnold et al. ................... 428/195 |

FOREIGN PATENT DOCUMENTS

| 1,291,960 | 10/1972 | United Kingdom |
| 959,670 | 6/1964 | United Kingdom |
| 906,934 | 9/1962 | United Kingdom |
| 1,307,995 | 2/1973 | United Kingdom |
| 1,079,661 | 8/1967 | United Kingdom |

Primary Examiner—George F. Lesmes
Assistant Examiner—P. J. Thibodeau
Attorney, Agent, or Firm—Young & Thompson

[57] ABSTRACT

A photosensitive sheet product which enables dry transfer sheets to be made very simply by a process involving photographic exposure, water-washing to remove unexposed parts of the photosensitive material and drying. The photo-sensitive material itself contains the resin or other adhesive present in the letters or other transferable images and the problem of the adhesiveness which would be apparent in the transferred characters or pictorial matter in the product is solved by making the dry transfer sheet with a temporary keycoat which transfers with the characters or pictorial matter and remains as a protective layer on the finished product. Another advantageous feature of the dry transfer sheets described is that they can be formulated so as to be pressure-transferable in the normal way or alternatively can be heated or solvent-treated to exhibit a permanently increased adhesiveness, making broad-area transfer possible using much lower transfer pressures than required in normal use.

7 Claims, 6 Drawing Figures

DRY TRANSFER SHEETS

This invention relates to dry transfer sheets and is particularly concerned with improved forms of dry transfer sheets, their methods of production and their use.

It is well known to produce graphic images such as lettering or other indicia by individually transferring the letters or other indicia from a dry transfer sheet which consists of a transparent or translucent support material carrying printed images, over which an adhesive has been applied. By laying the dry transfer sheet indicia-side down against a receiving surface, e.g. a sheet of plain paper, and rubbing the back of the sheet with a suitable burnishing stylus, the selected indicia are made to transfer from the support material to become preferentially adhered to the receiving surface. Such dry transfer sheets produce by printing are disclosed, for instance, in British Pat. Nos. 906,934 and 959,670.

Dry transfer sheets are normally produced by screen printing the desired indicia upon a transparent film or plastics sheet material and then overcoating the print with an adhesive material. It is not economic to use screen printing to produce a small number of printed sheets and, if the user requires special images of his own choice of colour and design in small numbers, the method is prohibitive in cost.

It is for this reason that photographic methods of producing dry transfer sheets have been proposed. For instance, in British Pat. No. 1,079,661, a photosensitive layer of dichromated gelatine is employed as the image-forming layer, but with the disadvantages that: (a) the storage life of dichromate-sensitized layers is too short for providing stockable photosensitive sheets; (b) excessively long exposures are required to give images of acceptable density; (c) the use of gelatine requires a carefully controlled warm water wash to process the layer to give the required transferable indicia; and (c) the adhesive required for transfer of the image is applied after the sheet has been processed.

In British Pat. No. 1,291,960, it is proposed that a transparent base sheet is coated with a light-sensitive layer, a pigmented layer, and an adhesive layer in various configurations relative to the base sheet. The material is exposed to light through a master transparency and is processed to give the required images in the form of dry transfer characters. However, the processing manipulations required to produce good images are not simple to handle and involve both aqueous and solvent treatments.

It is an object of the present invention to provide a material and a method for the production of dry transfer sheets in which a photo-polymerizable or photo-cross-linkable layer contains both the adhesive and the pigment and requires a simple processing in water to provide images that, when transferred, are non-tacky on their surface. The invention also provides the improved dry transfer sheets produced by such method.

According to one aspect of the invention, a dry transfer sheet comprises a transparent or otherwise translucent carrier sheet having thereon photographically produced stencil images formed of a photo-polymerizable or photo-crosslinkable film and containing an adhesive substance capable of providing pressure-sensitive adhesive properties to the image and, between this photosensitive layer and the carrier sheet, there is a layer of a temporary key-coat material which provides adhesion between the photosensitive layer and the carrier sheet in the dry state and during processing and which, upon transfer of the image from the carrier sheet, adheres sufficiently and preferentially to the image so as to transfer with it and thereby lower the surface tack of the transferred image.

To produce the dry transfer sheets, the photosensitive material is coated on a transparent or translucent carrier sheet and this is exposed through a suitable line or half-tone negative, e.g. a silver halide negative, to the light from a U.V. source, e.g. mercury vapour or carbon arc. It is then simply washed in cold water to remove the unexposed soluble areas of the coating, leaving the image as a coloured insolubilized layer in discrete units on the carrier sheet. After drying, the image is slightly adhesive.

In use the sheet is placed face down on a receiving surface, e.g. paper, metal, plastics film or glass, and the back of the sheet burnished with a suitable tool or stylus, e.g. a ballpoint pen, thus causing the required image or indicia to adhere to the receiving surface. The carrier sheet is then peeled away and if necessary repositioned to transfer other images to the receiving surface.

A convenient method of making the image areas adhesive is to incorporate a suitable adhesive resin directly into the photosensitive emulsion layer. One problem, however, in using photopolymer layers containing the adhesive is that the transferred image remains tacky and liable to stick to other sheets placed over it. We have now found that this can be avoided. In preparing photosensitive sheet materials by applying to a base sheet a coating of a photosensitive composition, it is often desirable and may even be necessary (depending upon the nature of the base sheet and of the photosensitive composition) to provide the base sheet first with a primer or key-coat, which ensures that the layer of the photosensitive composition adheres satisfactorily to the base sheet. Where the photosensitive sheet is prepared so as to allow the production of transfer sheets, such as is the case with the present invention, the key-coat can be temporary. This means that the key-coat need only retain the photosensitive layer in place during preparation of the photosensitive sheet material and, in a subsequent stage, the preparation from it of the dry transfer sheet per se. When the latter is used, it will be appreciated that the key-coat must either release the indicia from the base or transfer with them. The aforementioned problem of tackiness of tranferred images can now be solved, as it has been discovered that temporary key-coats can be provided which are not only entirely satisfactory in preparing the base for receiving the photosensitive layer and for retaining the indicia upon the dry transfer sheet until the latter is used, but also can then be transferred with the image to the new support. If at the same time the temporary key-coat consists of a material, i.e. a polymer or resin, which is impervious to the adhesive contained in the photosensitive layer, then its presence on top of the transferred image will overcome any tacky properties or problems of unwanted sticking to other surfaces.

The photo-polymerizable or photo-crosslinkable layer on the carrier sheet can be formed from any of the well-known photochemical systems such as dichromated colloids, ferric salts in colloids, silver halide gelatin, diazo resin colloids, unsaturated photopolymers, such as those based on cinnamic acid esters, quinone diazide resin systems. Particularly useful layers are those formed from water-soluble colloids containing an unsaturated vinyl monomer and a photo-sensitive leuco sulphuric ester dye, see our British Pat. No. 1307995.

The transparent or translucent carrier sheet can be chosen from a wide range of plastics films, e.g. polyvinyl chloride, polyvinyl chloride acetate copolymer, polyethylene terephthalate, cellulose acetate, polystyrene, polycarbonate and polyethylene. Transparentized paper of sufficiently clear characteristics can also be used.

The adhesives which can be incorporated in the photosensitive layer can consist of resins or polymers which have tacky properties at ambient temperatures. If the photosensitive layer is coated from an aqueous mixture, then it is convenient to incorporate the adhesive as an aqueous dispersion. Many suitable aqueous dispersions of soft or tacky resins are available for this purpose, the most common ones being those based on polyacrylate and polyvinyl acetate resins. Obviously the adhesive used must not be readily soluble in the solvent employed for washing out the image.

It is also envisaged to employ a photosensitive layer containing an adhesive of low tack properties, since this prevents premature transfer of the image and only those parts which receive sufficient pressure, e.g. by application of a stylus point, are transferred. If however, there is included in the layer a plasticising agent which is solid at room temperature, it has been found that, on the application of heat or wetting with an organic solvent, the plasticiser is caused to fuse with the adhesive resin and this greatly increases the tack properties of the layer. This increased tack property remains even when the temperature of the sheet has returned to normal ambient levels or the organic solvent has evaporated. This is presumably caused by the adhesive properties of the resin being permanently increased by the fusion of the plasticiser, either by the effect of the heat or the solubilizing action of the solvent. When the adhesive tack of the images is increased by this means, it is possible to transfer the images by broad area pressure and this greatly facilitates the application of large designs to a wide range of surfaces, e.g. wooden, plastic or metal sheets and wall surfaces, etc. It is not necessary to use a small area pressure implement, to effect transfer, but instead satisfactory transfer can be achieved by the use of a roller, scraper or other implement which exerts a relatively lower pressure over a much greater area.

Many so-called solid plasticizers can be used for this purpose, such as the solid phthalate esters, e.g. dicyclohexyl phthalate, para-toluene-sulphonamide and its derivatives, rosin and rosin derivatives, low molecular styrene resins, cyclohexanone resins, coumarone, indene and terpene resins.

If desired the plasticizer can be omitted from the photo-sensitive adhesive layer but, after processing the image, a solvent is applied containing the plasticizer, and this causes the tacky properties of the adhesive to be increased sufficiently to allow "broad area" transfer to be carried out.

The temporary key-coat applied between the photosensitive layer and the carrier sheet must consist of a substance which will not allow penetration of the adhesive from the photosensitive layer; otherwise, when the image is transferred to a receiving sheet the outermost surface will exhibit tacky properties.

The choice of the temporary key-coat is conditioned by: (a) the need to provide adequate adhesion between the photosensitive layer and the carrier sheet, both in the dry state and during processing that is, in the photosensitive sheet once it has been made and also during the time when it is being converted into the dry transfer sheet; (b) the ability to split cleanly and release from the carrier sheet, only where the image layer transfers; and (c) the ability to resist penetration of the adhesive substance or mixture from the image layer through to the surface of the protective temporary key-coat which becomes the outer surface after image transfer is effected.

Particularly suitable materials for the temporary key-coat are the polyamide and nylon polymers which are soluble in mixtures of water and an alcohol and these are disclosed in our co-pending British Application No. 39493/70. Such polyamides are of the type which are first methylolated and then etherified to produce solubility in a mixture of water and a lower alcohol. Other materials which are suitable as the temporary key-coat are rubbers or rubber based polymers and also polymers based upon vinyl pyridine. The rubber key-coats are particularly useful in conjunction with gelatine photosensitive layers.

In order that the transferable image is visible, it is usually necessary to add a pigment to the photosensitive layer. Any pigment which can be dispersed in the photosensitive mixture can be employed including black, white, coloured or metallic dispersions.

If the image is produced from a colourless or white pigmented photosensitive coating, then it is possible to convert it to any desired colour by bathing the processed sheet in a solution of dyestuff or painting such a solution on in locally selected areas. After application of the dyestuff solution, the excess is rinsed or blotted off and the sheet dried, when it is then ready for image transfer in the previously described manner. If desired, several colours can be applied to the same sheet to obtain selected different local colourations of the image or images.

It should be understood that while the general description of the invention is concerned with the preparation of dry transfer sheets in which characters such as letters or discrete designs are produced, it is also intended that images in line or halftone screen in various colours, such as pictures or illustrations, can be prepared and individually transferred to plain receiving sheets, or alternatively they can be superimposed on the same receiving sheet, either in register or predetermined relationship to each other. In this way it is possible to build up a coloured composite design from separate original transparencies, i.e. negatives, and to provide a so-called colour proof of the desired original matter. If colour separation negatives are used to prepare the dry transfer sheets, then provided these are made on photosensitive sheets which have been pigmented with the appropriate printing primary colours, e.g. yellow, magenta and cyan, then if the transfer images are made in register on a single sheet, a full colour print or proof will result.

An important attraction of the invention lies in the very free choice of master designs which can be used in exposing the photosensitive material, so that virtually any printed page or drawn master can be very quickly converted into the form of dry transfer sheets. Thus a picture, a printed device such as a trademark in a particular style, a sheet of music or a printed sample of a fancy typeface can be converted into dry transfer form, which can then be used to prepare graphic designs or type matter, etc. of an individual nature or requirement. Images can, of course, be transferred to other surfaces than paper, e.g. metal, glass, wood, plastic, and this allows the decoration or marking of such surfaces to provide notices, nameplates, plaques or the like.

EXAMPLE 1

A sheet of high density polyethylene, thickness 100 microns, is given the following temporary key coat:

| *Elvamide 8063 5% solution in methanol | — 85 gms. |
|---|---|
| 2-Ethoxyethanol | — 100 gms. |
| Methanol | — 300 gms. |

*Alcohol soluble polyamide sold by Du Pont Chemicals Ltd.

The coating is applied by the dip method and metered to a thin layer by use of a wire wound doctor bar having a wire thickness of 125 microns diameter.

This is followed by application of a pigmented light sensitive layer containing an adhesive material:

| Polyvinyl alcohol 88/8, 20% in H$_2$O | — 120 gms. |
|---|---|
| Polyacrylate dispersion, e.g. Vinacryl 4500* | — 120 gms. |
| Diethylene glycol (humectant) | — 25 gms |
| N,N-Methylene diacrylamide (monomer) | — 6 gms |
| Anthrasol Brown IRRD** (LSE dye) | — 2 gms |
| Black pigment dispersion | — 40 gms |
| Water | — 120 gms. |

*An aqueous dispersion of acrylic polymer supplied by Vinyl Products Ltd.
**A leuco sulphuric ester dye supplied by Hoechst Cassella Dyestuffs Ltd.

The coating is applied to give a dry weight of 35 gms per square meter. The dry transfer sheet is prepared by exposing the above sheet through the support in contact with a line transparency or negative of the required image. The exposing source can be a 125 Watt mercury vapour lamp at 18 inches from the negative and the time 2 minutes. After exposure the sheet is soaked in cold water for about one minute and then sprayed to complete the removal of the unexposed coating. The excess moisture is wiped off and the sheet dried.

In use the sheet is placed in contact with a receiving surface and those images selected for transfer are burnished on the back with a ballpoint pen. Such images are then found to transfer readily from the film support and adhere well to the the receiving surface. After transfer the images show no tackiness on their surface owing to the presence of the thin film of temporary key coat material. Visual inspection of the film support in the areas from which transfer has been effected reveals a faint reproduction of the images in the form of the non-transferred key-coat material, which remains on the carrier sheet. This demonstrates the excellent cleanliness of the splitting of the key-coat as between the transferred and non-transferred areas.

EXAMPLE 2

In place of the photosensitive layer used in Example 1, the following was applied on the same carrier sheet and temporary key coat:

| Polyvinyl alcohol 88/24 15% in H$_2$O | — 160 gms. |
|---|---|
| N,N-Methylene diacrylamide | — .3 gms. |
| Anthrasol Brown 1RRD | — 0.7 gms. |
| Black pigment 30% dispersion in H$_2$O | — 13.5 gms. |
| Diethylene glycol | — 7 gms. |
| Vinacryl 4511* | — 40 gms. |
| Silica | — 3 gms. |
| Howflex CP Dispersion** (solid plasticizer) | — 40 gms. |
| Water | — 50 gms. |

*Vinacryl 4511 is an aqueous dispersion of poly acrylate copolymer supplied by Vinyl Products Ltd.
**Howflex CP is a 60% aqueous dispersion of dicyclohexyl phthalate supplied by Laporte Industries Ltd.

After exposing and processing the sheet as in the previous example, the image was dried and adhesive tack was seen to be insufficient to effect good transfer of the image unless local pressure was applied with a stylus point. When the sheet was warmed to a temperature of about 70°–80° C, or alternatively wetted briefly with a thin application of trichlorethylene and dried off, it was found to have much stronger tack properties and thereby image transfer could be effected by placing the sheet against the receiving surface and passing over a flat wooden scraper to provide broad area pressure. After transfer, the surface of the image areas was seen to be free from tack or stickiness, owing to the presence of the temporary key coat that had transferred on top of the image.

EXAMPLE 3

A sheet of flexible polyvinyl chloride film as sold under the name of Craylon by Commercial Plastics Ltd. was coated with the following temporary key coat solution:

| Ultramid 1C* | — 50 gms. |
|---|---|
| 2-Ethoxyethanol | — 200 gms. |
| Methanol | — 800 gms. |

*Ultramid 1C is a soluble polyamide supplied by B.A.S.F. Chemicals Ltd.

The coating was applied and doctored with a wire wound bar having a wire thickness of 125 microns. After drying the sheet was then coated with the following photosensitive layer:

| Polyvinyl alcohol 88/24 | — 90 gms. |
|---|---|
| Diazo resin* | — 4 gms. |
| Black pigment dispersion | — 8 gms. |
| Vinacryl 4500** | — 100 gms. |
| Water | — 700 gms. |

*Diazo resin refers to the condensation product of 4, diazo-diphenylamine with an equivalent amount of formaldehyde and converted to the double zinc salt. See for example Brit. Pat. 418,011.
**Vinacryl 4500 is an aqueous dispersion of a polyacrylate resin copolymer supplied by Vinyl Products Ltd.

The coating is applied to the sheet to give a dry weight of 25 gms. per square meter. It was processed in a similar way to that described in Example 1, except that the exposure given was 6 minutes.

After processing and drying, the image could be transferred by rubbing on the back of the sheet and there was no tacky characteristic on the surface of the transfer.

EXAMPLE 4

A carrier sheet of polyethylene film was coated with the following temporary key coat.

| Parlon S5* | — 5 gms. |
|---|---|
| 1,1,1-trichloroethane | — 100 gms. |

*Parlon S5 is a chlorinated rubber sold by Hercules.

After drying, the sheet was then coated with the following photosensitive layer.

| | |
|---|---|
| Gelatine | — 20 gms. |
| Sucrose | — 12 gms. |
| Ammonium ferric oxalate | — 5 gms. |
| Green pigment paste | — 3 gms. |
| Vinamul 4511* | — 15 gms. |
| Water | — 100 gms. |

The sheet was exposed in contact with a line negative for 3 minutes to a mercury vapour lamp, 125 watt, at a distance of 18 inches. After exposure it was bathed for 1 minute in a 4% solution of hydrogen peroxide and then sprayed with warm water (35° C) to remove the unexpected portions of the coating. The remaining stencil image was dried off and could then be transferred to a receiving surface by burnishing the back of the carrier sheet in the manner previously described. The transferred image was found to be quite free of tack owing to the protection afforded by the rubber based temporary key coat that had transferred with the image.

EXAMPLE 5

A sheet of p.v.c. film was given the same temporary key coat as described in Example 1. The coating was metered to a thin layer with a doctor bar having a wire thickness of 125 microns.

After drying, the sheet was coated with the following photosensitive layer:

| | |
|---|---|
| Polyvinyl alcohol 88/24 15% in H₂O | — 300 gms. |
| Vinamul 8430* | — 40 gms. |
| Vinamul 4511** | — 80 gms. |
| Diethylene glycol | — 18 gms. |
| N,N-Methylene diacrylamide | — 5 gms. |
| Anthrasol Brown 1RRD | — 0.4 gms. |
| Titanium Dioxide | — 20 gms. |
| Water | — 150 gms. |

*Vinamul 8430 polyvinyl acetate emulsion supplied by Vinyl Products Ltd.
**Vinamul 4511 is a polyacrylate emulsion supplied by Vinyl Products Ltd.

The coating was applied to give a dry coating weight of 30 gms. per square meter. It was exposed and processed as in Example 1 except that the exposure time given was 1 minute.

The excess water was removed and a solution of dyestuff applied with a small brush or by gently swabbing with cotton wool. The excess was blotted and rinsed off and the image dried.

The dyes used were 2-3% solutions in water and examples are as follows:

| | |
|---|---|
| Patent Blue V | — C.I. 42045 |
| Stilbene Yellow 8G | — C.I. 40001 |
| Acid Magenta | — C.I. 42685 |

The coloured images were then transferred to a receiving sheet in the same manner as before.

EXAMPLE 6

In place of the temporary key-coat used in Example 1, poly-2-vinyl pyridine 5 grams, isopropylalcohol 100 grams were substituted. This mixture was applied to high density polyethylene sheets as described in Example 1 and the same light sensitive layer was employed.

In order that the invention may be fully appreciated, reference is made to the accompanying drawing, wherein the successive stages in converting a photosensitive sheet material according to the invention into a dry transfer sheet and then using the latter are illustrated diagrammatically; in the drawing.

Figure 1:
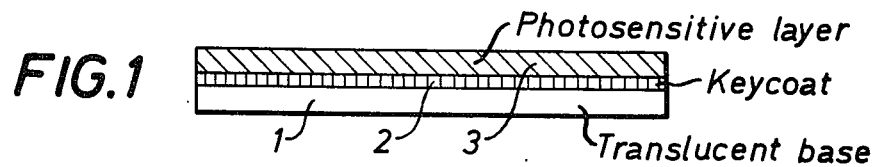
FIG. 1 shows in diagrammatic cross-section a photosensitive sheet material according to the invention.
Figure 2:
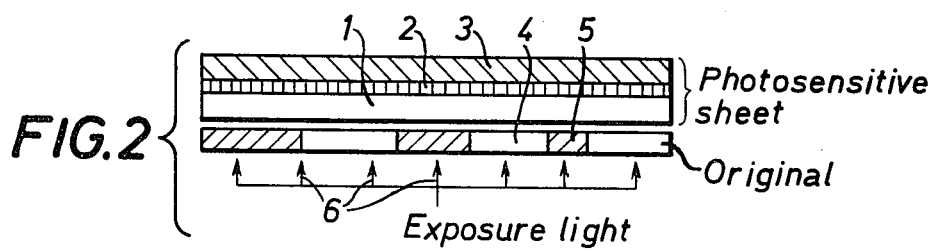
FIG. 2 shows the sheet material of FIG. 1 being exposed in contact with an original.
Figure 3:
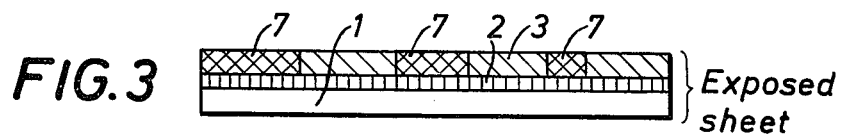
FIG. 3 shows the exposed sheet material, carrying an image of the letters or other indicia of the original.

The photosensitive sheet of FIG. 1 comprises a transparent of translucent base 1, carrying upon a surface the temporary keycoat 2 and, over that, the photosensitive layer 3. FIG. 2 shows an original 4 including letters 5 or other indicia in contact with the base 1 of the photosensitive sheet at the time of exposure, the exposure light being indicated by the arrows 6. It will be seen that exposure takes place through the original 4 and the base 1 and key-coat 2. The effect of exposure upon the photosensitive layer 3 is shown in FIG. 3, where the parts of the layer 3 which correspond to the indicia 5 become developed into copy indicia 7. On washing the exposed sheet of FIG. 3, the unexposed parts of the layer 3 are removed leaving the desired dry transfer sheet shown in FIG. 4, whereupon the copy indicia 7 are slightly adhesive owing to the presence of the adhesive material in the photosensitive composition used to make the layer 3.

Figure 4:
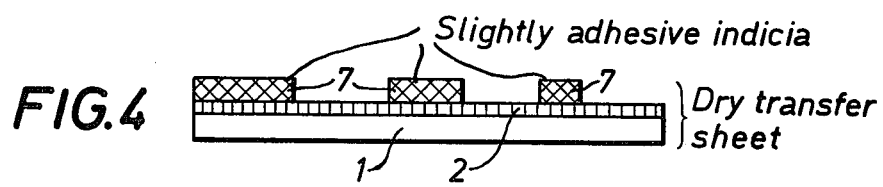
FIG. 4 shows the resultant dry transfer sheet after water-washing the product shown in FIG. 3 and drying to form the desired product.
Figure 5:
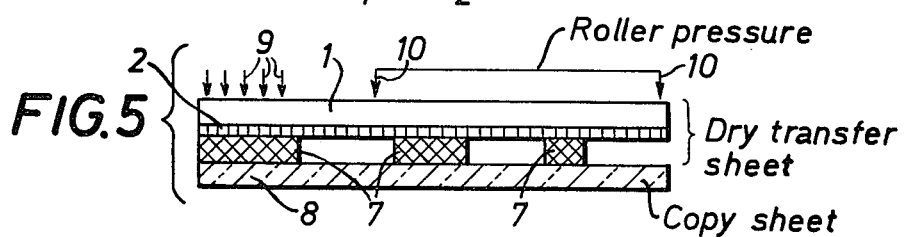
FIG. 5 shows the application of the dry transfer to a copy sheet.
Figure 6:
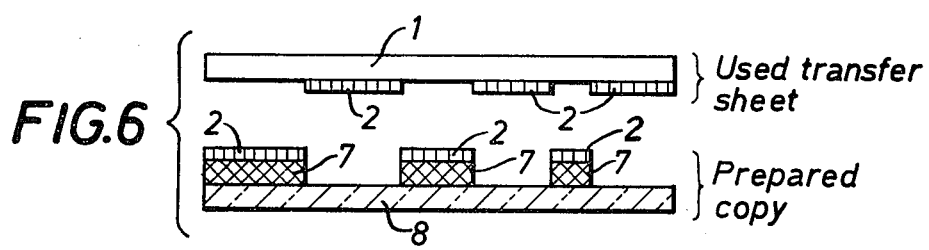
FIG. 6 shows the dry transfer sheet and the copy sheet of FIG. 5, after transfer of letters or other indicia and separation.

The dry transfer sheet of FIG. 4 is shown face down in use in FIG. 5, where the copy indicia 7 are in contact with the top surface of a copy sheet 8, to which the selected letters or other copy indicia 7 are to be transferred. This is done either by the use of a stylus or other point-like implement, as explained, which applies a relatively high pressure over a small area, as shown by the arrows 9, or by the use of a roller or other edge-like or block-like implement, which applies a relatively low pressure over a large area, the dry transfer sheet or the selected part of it having been heated or solvent-treated to increase the tack of the adhesive as explained above, as shown by the arrows 10. After transfer, the used transfer sheet is separated from the prepared copy as shown in FIG. 6, which shows how the parts of the key-coat 2 which corresponded to the background areas in the original 4 remain on the base 1, whereas the parts of the key-coat 2 which corresponded to the indicia 5 transfer with the copy indicia 7 and remain upon them, thereby preventing the adhesive in the indicia 7 from being contactable in the prepared copy. In other words, as will be seen from FIG. 6, the key-coat 2 separates from base 1 only directly over the selected indicia 7.

We claim:

1. In a dry transfer sheet, which comprises a transparent or otherwise translucent carrier sheet, and photographically-produced pressure-transferable stencil images of letters, numbers or other indicia disposed upon one side of the carrier sheet, the stencil images being formed of a photo-polymerizable or photo-crosslinkable film derived from a photo-sensitive layer provided upon the carrier sheet and subjected to photographic exposure and development in conjunction with an original of the indicia, such photosensitive layer and the stencil images derived therefrom containing an adhesive substance capable of providing the stencil images with a pressure-sensitive adhesive property; the improvement comprising, between the carrier sheet and the stencil images carried thereby, a layer of a temporary keycoat material which provides adhesion between the carrier sheet and the photosensitive layer in the dry state and during processing, the temporary keycoat material remaining on the carrier sheet during development, the temporary keycoat material further having the properties, upon transfer of a stencil image from the carrier sheet, of separating from the sheet only directly over the selected letter, number or other indicium and adhering sufficiently to the stencil image to transfer with it, whereby the temporary keycoat material lowers the surface tack of the transferred stencil image, the remainder of said keycoat material remaining on said carrier sheet, the transferred keycoat material thereafter precluding penetration of the adhesive material from the transferred stencil image into the transferred keycoat material, said letters, numbers or other indicia being spaced apart from each other thereby to be selectively individually transferable, and a copy sheet that receives a transferred said stencil image, said transferred image having a greater adhesion to said copy sheet than said keycoat has to said carrier sheet, said keycoat having a greater adhesion to said transferred image than said keycoat has to said carrier sheet, and said keycoat having a greater adhesion to said carrier sheet than to said copy sheet.

2. A dry transfer sheet according to claim 1, wherein the temporary keycoat material is selected from the group consisting of alcohol-soluble polyamide polymers, rubbers and rubber-based polymers and vinyl pyridine polymers.

3. A dry transfer sheet according to claim 1, wherein the carrier sheet is selected from the group consisting of plastics films and transparentized paper.

4. A dry transfer sheet according to claim 1, wherein the adhesive material incorporated in the photosensitive layer and in the stencil images derived therefrom comprises a resin or polymer having tacky properties at ambient temperatures.

5. A dry transfer sheet according to claim 1, wherein the photosensitive layer and the stencil images derived therefrom contain an adhesive having low tack properties such that stencil image transfer requires the application of pressure equivalent to that employed in the operation of a writing instrument, the photosensitive layer also including a plasticising agent which is solid at room temperature, whereby the application of heat to the dry transfer sheet or the application of a solvent for solubilizing the plasticising agent causes the latter to fuse with the adhesive material and provide the stencil images with increased tack properties, so that stencil image transfer can then be effected by the application of a lower pressure.

6. A dry transfer sheet according to claim 5, wherein the plasticiser is selected from the group consisting of solid phthalate esters, paratoluene-sulphonamide and its derivatives, rosin and rosin derivatives, low molecular styrene resins, cyclohexanone resins, coumarone, indene and terpene resins.

7. A dry transfer sheet according to claim 1, wherein the photosensitive layer and the stencil images derived therefrom contain one or more black, white, coloured or metallic pigment dispersions.

* * * * *